United States Patent
Lee et al.

(10) Patent No.: US 12,015,073 B2
(45) Date of Patent: *Jun. 18, 2024

(54) THIN FILM STRUCTURE INCLUDING DIELECTRIC MATERIAL LAYER AND ELECTRONIC DEVICE INCLUDING THE SAME

(71) Applicant: Samsung Electronics Co., Ltd., Suwon-si (KR)

(72) Inventors: Woojin Lee, Suwon-si (KR); Kiyoung Lee, Seoul (KR); Yongsung Kim, Suwon-si (KR); Eunsun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/984,877

(22) Filed: Nov. 10, 2022

(65) Prior Publication Data

US 2023/0074895 A1 Mar. 9, 2023

Related U.S. Application Data

(63) Continuation of application No. 16/779,863, filed on Feb. 3, 2020, now Pat. No. 11,532,722.

(30) Foreign Application Priority Data

Aug. 8, 2019 (KR) .......................... 10-2019-0096915

(51) Int. Cl.
*H01L 29/51* (2006.01)
*C01G 23/00* (2006.01)
(Continued)

(52) U.S. Cl.
CPC .......... *H01L 29/516* (2013.01); *C01G 23/006* (2013.01); *C01G 35/006* (2013.01);
(Continued)

(58) Field of Classification Search
CPC .... G01J 5/12; H01L 29/516; H01L 27/11502; C01P 2002/34
See application file for complete search history.

(56) References Cited

U.S. PATENT DOCUMENTS

| 4,880,758 A | 11/1989 | Heistand, II et al. |
| 10,311,992 B2 | 6/2019 | Engel-Herbert et al. |

(Continued)

FOREIGN PATENT DOCUMENTS

| CN | 109297608 A | 2/2019 |
| JP | H06104396 A | 4/1994 |

(Continued)

OTHER PUBLICATIONS

A. Sendil Kumar et al., "Magnetic and ferroelectric properties of Fe doped SrTiO3-δ films" *J. Phys.: Conf. Ser.*, 200, Sep. 2010, 2010.

(Continued)

*Primary Examiner* — Khanh T Nguyen
(74) *Attorney, Agent, or Firm* — Harness, Dickey & Pierce, P.L.C.

(57) ABSTRACT

A thin film structure including a dielectric material layer and an electronic device to which the thin film structure is applied are provided. The dielectric material layer includes a compound expressed by $ABO_3$, wherein at least one of A and B in $ABO_3$ is substituted and doped with another atom having a larger atom radius, and $ABO_3$ becomes $A_{1-x}A'_x B_{1-y}B'_y O_3$ (where x>=0, y>=0, at least one of x and y≠0, a dopant A' has an atom radius greater than A and/or a dopant B' has an atom radius greater than B) through substitution and doping. A dielectric material property of the dielectric (Continued)

material layer varies according to a type of a substituted and doped dopant and a substitution doping concentration.

18 Claims, 20 Drawing Sheets

(51) Int. Cl.
    *C01G 35/00*     (2006.01)
    *H10B 51/00*     (2023.01)
    *H10B 53/00*     (2023.01)
(52) U.S. Cl.
    CPC ............. *H10B 51/00* (2023.02); *H10B 53/00* (2023.02); *C01P 2002/34* (2013.01); *C01P 2002/52* (2013.01); *C01P 2002/77* (2013.01); *C01P 2006/40* (2013.01)

(56) References Cited

U.S. PATENT DOCUMENTS

| | | | |
|---|---|---|---|
| 10,800,665 | B1 | 10/2020 | Babiniec et al. |
| 11,532,722 | B2* | 12/2022 | Lee .................. H01L 29/78391 |
| 2003/0038311 | A1* | 2/2003 | Basceri ............ H01L 21/02186 257/296 |
| 2005/0167712 | A1 | 8/2005 | Kijima et al. |
| 2008/0066496 | A1 | 3/2008 | Nagaya et al. |
| 2015/0187842 | A1* | 7/2015 | Cho ................... H10N 70/8825 257/421 |

FOREIGN PATENT DOCUMENTS

| | | |
|---|---|---|
| JP | 6112499 B2 | 3/2014 |
| KR | 20020028281 A | 4/2002 |
| KR | 10-0598747 B1 | 7/2005 |
| KR | 10-2012-0077401 A | 7/2012 |

OTHER PUBLICATIONS

Hyun kyung Cho et al., "The effect of Cr doping on the electrical properties of $Ba_{0.7}Sr_{0.3}TiO_3$ thin films" *Bulletin of the Institute for Basic Science*, vol. 17, 53-58, 2005.

Korean Office Action dated Nov. 21, 2023 issued in Korean Patent Application No. 10-2019-0096915. English translation has been provided.

* cited by examiner $Sr_x Ba_{1-x} TiO_3$ $SrTi_xZr_{1-x}O_3$

FIG. 6

| Mono-doping ($Sr_{1-x} A'_x TiO_3$ or $SrTi_{1-x} B'_x O_3$) | | | |
|---|---|---|---|
| Doping concentration (x) for ferroelectronics (at. %) | | | |
| $Ba_{Sr}$ | $Zr_{Ti}$ | $Hf_{Ti}$ | $Sn_{Ti}$ |
| 32.3~50 | 11.4~50 | 15.1~50 | 18.4~50 |

FIG. 7B

| Co-doping ($Sr_{1-x}A'_xTi_{1-y}B'_yO_3$) | | | |
|---|---|---|---|
| Doping concentration (x) for ferroelectronics (at. %) | | | |
| x : y | $Ba_{Sr}$ – $Hf_{Ti}$ | $Ba_{Sr}$ – $Zr_{Ti}$ | $Ba_{Sr}$ – $Sn_{Ti}$ |
| 1 : 0.5 | 15.5 ~ 50 | 13.2 ~ 50 | 17.1 ~ 50 |
| 1 : 1 | 10.3 ~ 50 | 8.4 ~ 50 | 11.7 ~ 50 |
| 1 : 1.5 | 7.7 ~ 50 | 6.1 ~ 50 | 8.9 ~ 50 |
| 1 : 2 | 6.1 ~ 50 | 4.8 ~ 50 | 7.2 ~ 50 |

FIG. 8B

| Co-doping ($Sr_{1-x} A'_x Ti_{1-x} B'_x O_3$) | | | | |
|---|---|---|---|---|
| Doping concentration (x) for ferroelectronics (at. %) | | | | |
| $Cs_{Sr}$–$Nb_{Ti}$ | $Cs_{Sr}$–$Ta_{Ti}$ | $Rb_{Sr}$–$Nb_{Ti}$ | $Rb_{Sr}$–$Ta_{Ti}$ | $K_{Sr}$–$Nb_{Ti}$ |
| 12.9 ~ 50 | 11.5 ~ 50 | 20.6 ~ 50 | 19.8 ~ 50 | 30.5 ~ 50 |
| $K_{Sr}$–$Ta_{Ti}$ | $La_{Sr}$–$In_{Ti}$ | $La_{Sr}$–$Sc_{Ti}$ | $La_{Sr}$–$Y_{Ti}$ | |
| 28.8 ~ 50 | 11.4 ~ 50 | 18.9 ~ 50 | 6.3 ~ 50 | |

FIG. 10B

| Mono-doping ($K_{1-x}A'_xTaO_3$) ||
|---|---|
| Doping concentration (x) for ferroelectrics (at. %) ||
| $Cs_K$ | $Rb_K$ |
| 24.7 ~ 50 | 71.3 |

FIG. 11B

| Co-doping ($K_{1-2x} A'_{2x} Ta_{1-x} B'_x O_3$) | | |
|---|---|---|
| Doping concentration (x) for ferroelectrics (at. %) | | |
| $2Ba_K - In_{Ta}$ | $2Ba_K - Sc_{Ta}$ | $2Ba_K - Y_{Ta}$ |
| 7.8 ~ 25 | 9.8 ~ 25 | 5.0 ~ 25 |

FIG. 11C

| Co-doping ($K_{1-x}A'_xTa_{1-x}B'_xO_3$) | | | | | |
|---|---|---|---|---|---|
| Doping concentration (x) for ferroelectronics (at. %) | | | | | |
| $Ba_K - Hf_{Ta}$ | $Ba_K - Sn_{Ta}$ | $Ba_K - Zr_{Ta}$ | $La_K - In_{Ta}$ | $La_K - Sc_{Ta}$ | $La_K - Y_{Ta}$ |
| 14.4 ~ 50 | 17.9 ~ 50 | 10.7 ~ 50 | 13.9 ~ 50 | 22.3 ~ 50 | 7.4 ~ 50 |

THIN FILM STRUCTURE INCLUDING DIELECTRIC MATERIAL LAYER AND ELECTRONIC DEVICE INCLUDING THE SAME

CROSS-REFERENCE TO RELATED APPLICATION

This application is a continuation of U.S. application Ser. No. 16/779,863, filed on Feb. 3, 2020, which claims the benefit of Korean Patent Application No. 10-2019-0096915, filed on Aug. 8, 2019, in the Korean Intellectual Property Office, the disclosure of each of which is incorporated herein in its entirety by reference.

BACKGROUND

1. Field

The present disclosure relates to a thin film structure including a dielectric material layer and an electronic device including the thin film structure.

2. Description of Related Art

In recent years, along with the miniaturization and manufacture of higher performance electronic apparatuses, there has been a demand for miniaturization and higher performance of electronic devices employed in various electronic circuits. Such electronic circuits include a plurality of metal insulator metal (MIM) capacitors and metal oxide semiconductor (MOS) transistors. To realize miniaturization, larger capacity, and higher performance for MIM capacitors and MOS transistors, there is a need to develop dielectric materials having higher permittivity and/or lower leakage current characteristics even at a smaller thickness.

SUMMARY

Provided are thin film structures including a dielectric material layer in which property of a dielectric material is converted through substitution doping, and electronic devices including the thin film structures.

Additional aspects will be set forth in part in the description which follows and, in part, will be apparent from the description, or may be learned by practice of the presented embodiments of the disclosure.

According to an aspect of an embodiment, a thin film structure includes a dielectric material layer including a compound expressed by $ABO_3$, wherein at least one of A and B in $ABO_3$ is substituted and doped with another atom having a larger atom radius, and $ABO_3$ becomes $A_{1-x}A'_xB_{1-y}B'_yO_3$ (where x>=0, y>=0, at least one of x and y≠0, a dopant A' has an atom radius greater than A and/or a dopant B' has an atom radius greater than B) through substitution and doping, and a dielectric material property of the dielectric material layer varies according to a type of a substituted and doped dopant and a substitution doping concentration.

Atoms of A and A', B and B', or A+B and A'+B' may have the same valence electron number.

A tensile strain may be induced through substitution and doping such that the dielectric material layer converts a paraelectric material to a ferroelectric material or improves a dielectric constant.

A may be Sr, B may be Ti, A' may be any one selected from Ba, Cs, Rb, and K, and B' may be any one selected from Zr, Hf, Sn, Nb, and Ta.

A compound expressed by $ABO_3$ may be $SrTiO_3$, and Ti may be substituted and doped with any one of Zr, Hf, and Sn.

Ti may be substituted and doped with Zr at 11.4 at. % or more, Ti may be substituted and doped with Hf at 15.1 at. % or more, and Ti may be substituted and doped with Sn at 18.4 at. % or more.

A compound expressed by $ABO_3$ may be $SrTiO_3$, and Sr may be substituted and doped with Ba at 32.3 at. % or more.

A compound expressed by $ABO_3$ may be $SrTiO_3$, Sr and Ti may be substituted and doped, and Sr may be substituted with Ba, and Ti may be substituted and doped with any one of Hf, Zr, and Sn.

When, Sr is substituted and doped with Ba, and Ti is substituted and doped with Hf and a ratio at which Sr is substituted and doped with Ba, Ti is substituted and doped with Hf is 1:0.5, 1:1, 1:1.5, and 1:2, Sr may be substituted and doped with Ba at 15.5 at. % or more, 10.3 at. % or more, 7.7 at. % or more, and 6.1 at. % or more, respectively when Sr is substituted and doped with Ba, and Ti is substituted and doped with Zr, and a ratio at which Sr is substituted and doped with Ba, Ti is substituted and doped with Zr, is 1:0.5, 1:1, 1:1.5, and 1:2, Sr may be substituted and doped with Ba at 13.2 at. % or more, 8.4 at. % or more, 6.1 at. % or more, and 4.8 at. % or more, respectively or when Sr is substituted and doped with Ba, and Ti is substituted and doped with Sn, and a ratio at which Sr is substituted and doped with Ba, Ti is substituted and doped with Sn, is 1:0.5, 1:1, 1:1.5, and 1:2, Sr may be substituted and doped with Ba at 17.1 at. % or more, 11.7 at. % or more, Ba at 8.9 at. % or more, and 7.2 at. % or more, respectively.

A compound expressed by $ABO_3$ may be $SrTiO_3$, Sr and Ti may be substituted and doped, Sr may be substituted and doped with any one of Cs, Rb, and K, and Ti may be substituted and doped with any one of Nb and Ta or Sr may be substituted and doped with La and Ti may be substituted and doped with any one of In, Sc, and Y.

Sr and Ti may be substituted and doped with Cs and Nb respectively at 12.9 at. % or more, Sr and Ti may be substituted and doped with Cs and Ta respectively at 11.5 at. % or more, Sr and Ti may be substituted and doped with Rb and Nb respectively at 20.6 at. % or more, Sr and Ti may be substituted and doped with Rb and Ta respectively at 19.8 at. % or more, Sr and Ti may be substituted and doped with K and Nb respectively at 30.5 at. % or more, Sr and Ti are substituted and doped with K and Ta respectively at 28.8 at. % or more, Sr and Ti may be substituted and doped with La and In respectively at 11.4 at. % or more, Sr and Ti may be substituted and doped with La and Sc respectively at 18.9 at. % or more, or Sr and Ti may be substituted and doped with La and Y respectively at 6.3 at. % or more.

A may be K and B may be Ta, A' may be any one selected from Cs, Rb, Ba, and La, and B' may be any one selected from In, Sc, Y, Hf, Sn, and Zr.

A compound expressed by $ABO_3$ may be $KTaO_3$, K may be substituted and doped with Cs at 24.7 at. % or more and 50 at. % or less, or K may be substituted and doped with Rb at 71.3 at. % or more.

A compound expressed by $ABO_3$ may be $KTaO_3$, K and Ta may be substituted and doped, K and Ta may be substituted and doped with 2Ba and In respectively at 7.8 at. % or more, K and Ta may be substituted and doped with 2Ba and Sc respectively at 9.8 at. % or more, or K and Ta may be substituted and doped with 2Ba and Y respectively at 5.0 at. % or more.

Substitution and doping of A of the dielectric material layer may be performed in a range of 50% or less, substitution and doping of B may be performed in a range of 25% or less, and substitution and doping of A and B may be performed at a ratio of 2:1.

A compound expressed by $ABO_3$ may be $KTaO_3$, K and Ta may be substituted and doped with Ba and Hf respectively at 14.4 at. % or more, K and Ta may be substituted and doped with Ba and Sn respectively at 17.9 at. % or more, K and Ta may be substituted and doped with Ba and Zr respectively at 10.7 at. % or more, K and Ta may be substituted and doped with La and In respectively at 13.9 at. % or more, K and Ta may be substituted and doped with La and Sc respectively at 22.3 at. % or more, or K and Ta may be substituted and doped with La and Y respectively at 7.4 at. % or more.

Substitution and doping of any one of A and B or each of A and B of the dielectric material layer may be performed in a range of 50% or less.

According to an aspect of another embodiment, an electronic device includes a thin film structure including the dielectric material layer and an upper electrode layer provided on a dielectric material layer of the thin film structure, the dielectric material layer exhibits a ferroelectric property and is used as a ferroelectric memory.

According to an aspect of another embodiment, an electronic device includes a thin film structure including the dielectric material layer and first and second metal layers provided on both sides of a dielectric material layer of the thin film structure, the first metal layer, the dielectric material layer, and the second metal layer constitute a capacitor.

The capacitor may be included in a unit cell of a memory.

The dielectric material layer of the thin film structure according to an embodiment may include a compound expressed by $ABO_3$, wherein at least one of A and B in $ABO_3$ may be substituted and doped with another atom having a larger atomic radius, and according to a type of a substituted and doped dopant and the substitution doping concentration, a paraelectric property may be converted to a ferroelectric property and/or a permittivity may increase.

Therefore, the electronic device including the dielectric material layer may substitute and dope the dielectric material layer to exhibit the ferroelectric property, thereby implementing a ferroelectric memory, or implementing a capacitor having a higher permittivity or the electronic device including the capacitor.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 shows a doping concentration range in which a ferroelectric transition occurs from paraelectric to ferroelectric when $SrTiO_3$ is applied to a dielectric material layer as a compound expressed by $ABO_3$, and mono doping ($Sr_{1-x}A'_xTiO_3$ or $SrTi_{1-x}B'_xO_3$) of substituting and doping ($Ba_{Sr}$) Sr with Ba, substituting and doping ($Ti_{Zr}$) Ti with Zr, substituting and doping ($Ti_{Hf}$) Ti with Hf, or substituting and doping ($Ti_{Sn}$) Ti with Sn is performed;

FIG. 7B shows a doping concentration range in which a ferroelectric transition occurs from paraelectric to ferroelectric when $SrTiO_3$ is applied to a dielectric material layer as a compound expressed by $ABO_3$ both Sr and Ti are substituted and doped, and co-doping ($Sr_{1-x}A'_xTi_{1-y}B'_yO_3$) of substituting and doping ($Ba_{Sr}$—$Hf_{Ti}$) Sr and Ti with Ba and Hf, respectively, substituting and doping ($Ba_{Sr}$—$Zr_{Ti}$) Sr and Ti with Ba and Zr, respectively, and substituting and doping ($Ba_{SR}$—$Sn_{Ti}$) Sr and Ti with Ba and Sn, respectively, is performed;

FIG. 8B shows a doping concentration range in which a ferroelectric transition occurs from paraelectric to ferroelectric when $SrTiO_3$ is applied to a dielectric material layer as a compound expressed by $ABO_3$, both Sr and Ti are substituted and doped, and co-doping ($Sr_{1-x}A'_xTi_{1-x}B'_xO_3$) of substituting and doping ($Cs_{Sr}$—$Nb_{Ti}$) Sr and Ti with Cs and Nb, respectively, substituting and doping ($Cs_{Sr}$—$Ta_{Ti}$) Sr and Ti with Cs and Ta, respectively, substituting and doping ($Rb_{Sr}$—$Nb_{Ti}$) Sr and Ti with Rb and Nb, respectively, substituting and doping ($Rb_{Sr}$—$Ta_{Ti}$) Sr and Ti with Rb and Ta, respectively, substituting and doping ($K_{Sr}$—$Nb_{Ti}$) Sr and Ti with K and Nb, respectively, substituting and doping ($K_{Sr}$—$Ta_{Ti}$) Sr and Ti with K and Ta, respectively, substituting and doping ($La_{Sr}$—$In_{Ti}$) Sr and Ti with La and In, respectively, substituting and doping ($La_{Sr}$—$Sc_{Ti}$) Sr and Ti with La and Sc, respectively, and substituting and doping ($La_{Sr}$—$Y_{Ti}$) Sr and Ti with La and Y, respectively, is performed;

FIG. 10B shows a doping concentration range in which a ferroelectric transition occurs from paraelectric to ferroelectric when $KTaO_3$ is applied to a dielectric material layer as a compound expressed by $ABO_3$, and mono doping ($K_{1-x}A'_xTaO_3$) of substituting and doping ($Cs_K$) K with Cs and substituting and doping ($Rb_K$) K with Rb is performed;

FIG. 11B shows a doping concentration range in which a ferroelectric transition occurs from paraelectric to ferroelectric when $KTaO_3$ is applied to a dielectric material layer as a compound expressed by $ABO_3$, both K and Ta are substituted and doped, co-doping $(K_{1-2x}A'_{2x}Ta_{1-x}B'_xO_3)$ of substituting and doping $(2Ba_K—In_{Ta})$ K and Ta with 2Ba and In, respectively, substituting and doping $(2Ba_K—Sc_{Ta})$ K and Ta with 2Ba and Sc, respectively, and substituting and doping $(2Ba_K—Y_{Ta})$ K and Ta with 2Ba and Y, respectively, is performed;

FIG. 11C shows a doping concentration range in which a ferroelectric transition occurs from paraelectric to ferroelectric when $KTaO_3$ is applied to a dielectric material layer as a compound expressed by $ABO_3$, both K and Ta are substituted and doped, co-doping $(K_{1-x}A'_xTa_{1-x}B'_xO_3)$ of substituting and doping $(Ba_K—Hf_{Ta})$ K and Ta with Ba and Hf, respectively, substituting and doping $(Ba_K—Sn_{Ta})$ K and Ta with Ba and Sn, respectively, substituting and doping $(Ba_K—Zr_{Ta})$ K and Ta with Ba and Zr, respectively, substituting and doping $(La_K—In_{Ta})$ K and Ta with La and In, respectively, substituting and doping $(La_K—Sc_{Ta})$ K and Ta with La and Sc, respectively, and substituting and doping $(La_K—Y_{Ta})$ K and Ta with La and Y, respectively, is performed;

DETAILED DESCRIPTION

Figure 1:
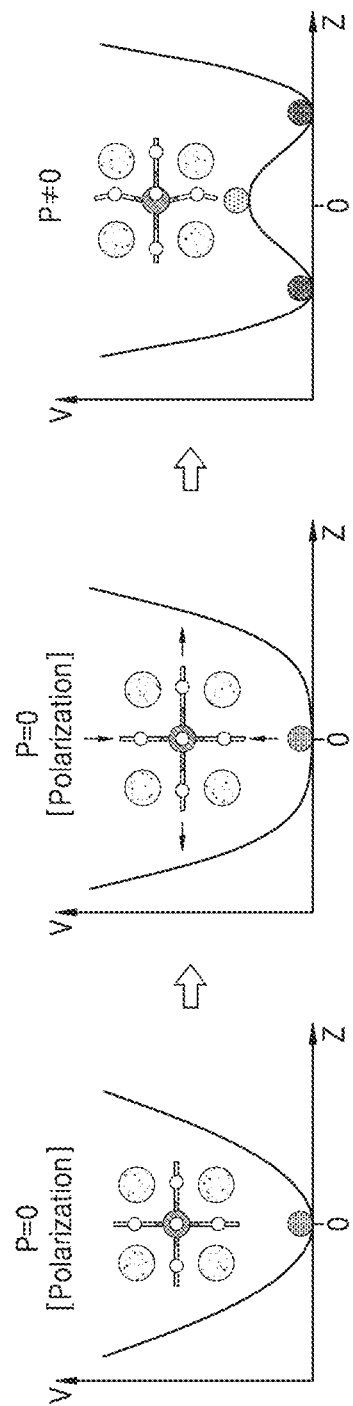
FIG. 1 shows a process in which a paraelectric property transitions to a ferroelectric property according to applied stress when a biaxial strain is applied.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings. In the following drawings, like reference numerals refer to like elements, and the size of each element in the drawings may be exaggerated for clarity and convenience of explanation. Meanwhile, the embodiments described below are merely illustrative, and various other modifications can be made from these embodiments.

Hereinafter, when a first element is described as being "above" or "on" a second element, embodiments using these expressions may include the case in which the first element may be directly on the second element and the case in which the first element is located above the second element while the first and second elements do not contact each other. As used herein, the singular forms "a", "an", and "the" are intended to include the plural forms as well, unless the context clearly indicates otherwise. When a portion "includes" an element, unless otherwise described, another element may be further included, rather than the presence of other elements being excluded. The use of the terms "a" and "an" and "the" and similar referents in the context of describing the disclosure (especially in the context of the following claims) are to be construed to cover both the singular and the plural.

When an electric field is applied to a dielectric material, a dielectric polarization phenomenon occurs in which polar molecules are aligned. The degree of polarization is proportional to the electric field. The extent at which the degree of the dielectric polarization is proportional to the applied electric field may be expressed as a permittivity. In general, the permittivity $\varepsilon$ of dielectric material may be expressed as a relative permittivity $\varepsilon_r$, that is, a ratio with respect to the permittivity $\varepsilon_0$ of vacuum, and the relative permittivity may also be called a dielectric constant. Because the permittivity to be used below does not deal with absolute values, these expressions may be used together.

Due to the molecular structure of the dielectric material, the extent at which the degree of the dielectric polarization is proportional to the applied electric field may vary depending on a direction of the applied electric field E.

A material showing a paraelectric property generates the dielectric polarization at a certain rate in proportion to the electric field E. In the case of a material showing a ferroelectric property, even after the dielectric polarization is formed by the applied electric field E and then the applied electric field E disappears, the dielectric polarization does not become 0 and shows a certain level of residual polarization. That is, the material showing the ferroelectric property has a polarization property depending on a history of the applied electric field E, the ferroelectric property has a higher permittivity than the paraelectric property, and the material showing the ferroelectric property shows the residual polarization characteristic even after the applied electric field E disappears, and thus the ferroelectric property may be applied to a nonvolatile memory device in that the ferroelectric property shows the residual polarization characteristic.

A ferroelectric thin film including such a ferroelectric material or a dielectric thin film having a higher permittivity may be applied to various fields such as a nonvolatile memory device such as a FERAM device, etc., a dynamic random access memory (DRAM) device, a capacitor, etc.

FIG. 1 shows a process in which a paraelectric property transitions to a ferroelectric property according to applied stress when a biaxial strain is applied. As shown in FIG. 1, when a predetermined (or alternatively, desired) or more tensile strain is applied to a dielectric material, it may be seen that a phase of the dielectric material transitions from the paraelectric property to the ferroelectric property.

According to a method of converting dielectric material properties according to an embodiment, substitution and doping may be applied to a dielectric material layer including a compound expressed by $ABO_3$, that is, a compound having a perovskite structure. At this time, when the dielectric material layer is substituted and doped with an atom having a larger atom radius, because a tensile strain is generated in the dielectric material layer, when a type of a substituted and doped dopant and the substitution doping concentration are controlled, a paraelectric material may be converted to a ferroelectric material or a material having a higher permittivity. At this time, because the generated tensile strain is due to substitution and doping of the atom having the relatively large radius, a uniform tensile strain may be generated in three directions. Here, the method of converting dielectric material properties according to an embodiment is not limited to converting the paraelectric material to the ferroelectric material through substitution and doping, and may include converting the paraelectric material to the material having the higher permittivity.

Figure 2:
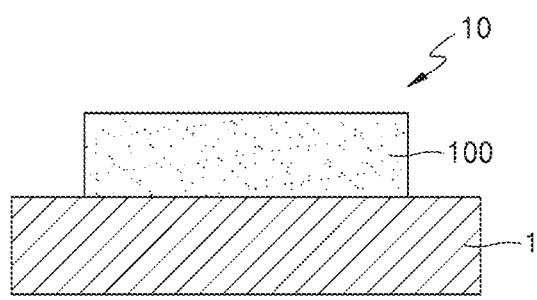
FIG. 2 shows an example of a thin film structure including a dielectric material layer according to an embodiment.

FIG. 2 shows an example of a thin film structure 10 including a dielectric material layer 100 according to an embodiment.

Referring to FIG. 2, the thin film structure 10 according to an embodiment may include the dielectric material layer 100 on a base layer 1. According to an embodiment, the base layer 1 may be a substrate, and may further include various structures of an electronic device to which the thin film structure 10 is applied.

According to an embodiment, the dielectric material layer 100 may include a compound expressed by $ABO_3$, wherein at least one of A and B in $ABO_3$ is substituted and doped with another atom having a larger atom radius. Such $ABO_3$ may become $A_{1-x}A'_xB_{1-y}B'_yO_3$ (where x>=0, y>=0, at least one of x and y≠0, a dopant A' has an atom radius greater than A and/or a dopant B' has an atom radius greater than B) through substitution and doping.

The dielectric material property of the dielectric material layer 100 including the compound expressed by $ABO_3$ may vary according to a type of a substituted and doped dopant and the substitution doping concentration. In addition, because the at least one of A and B in $ABO_3$ is substituted and doped with the other atom having the larger atom radius, as may be seen in various embodiments described below, a tensile strain may be induced through substitution and doping, and thus the dielectric material layer 100 may convert a paraelectric material to a ferroelectric material or improve a dielectric constant.

According to an embodiment, the dielectric material layer 100 including the compound expressed by $ABO_3$ may substitute only one of A and B or both through substitution and doping. That is, the dielectric material layer 100 may substitute A with A', B with B', or A and B with A' and B', respectively. At this time, when only A is substituted and doped with A', the dopant A' may be an element of an atom having the same valence electron number as A and a larger atom radius than A. Also, when only B is substituted and doped with B', the dopant B' may be an element of an atom having the same valence electron number as B and a larger atom radius than B. Also, when both A and B are substituted and doped, while an atom of A'+B' has the same valence electron number as an atom of A+B, the dopant A' may be an element of an atom having a larger atom radius than A, the dopant B' may be an element of an atom having a larger atom radius than B or both dopants A' and B' may be elements of atoms having a larger atom radius than A and B, respectively.

Substitution and doping of any one of A and B or each of A and B of the dielectric material layer 100 may be performed, for example, within a range of 50% or less, or substitution and doping may be performed up to a range of 50% or more in order to achieve a desired dielectric property conversion.

The dielectric material layer 100 may include, for example, $SrTiO_3$, $KTaO_3$, etc. as the compound expressed by $ABO_3$. According to an embodiment, when $SrTiO_3$ is applied to the dielectric material layer 100 as the compound expressed by $ABO_3$, that is, when A is Sr and B is Ti, the dopant A' may be any one selected from Ba, Cs, Rb, and K and the dopant B' may be any one selected from Zr, Hf, Sn, Nb, and Ta. According to an embodiment, when $KTaO_3$ is applied to the dielectric material layer 100 as the compound expressed by $ABO_3$, that is, when A is K and B is Ta, the dopant A' may be any one selected from Cs, Rb, Ba, and La, and the dopant B' may be any one selected from In, Sc, Y, Hf, Sn, and Zr.

Figure 3A:
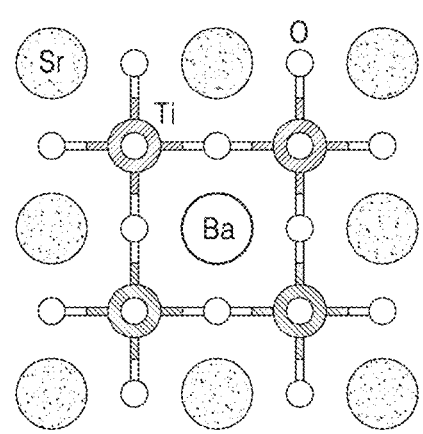
FIG. 3A shows an example ($SrTiO_3 \rightarrow Sr_xBa_{1-x}TiO_3$) of substituting and doping Sr in $SrTiO_3$ to Ba.
Figure 3B:
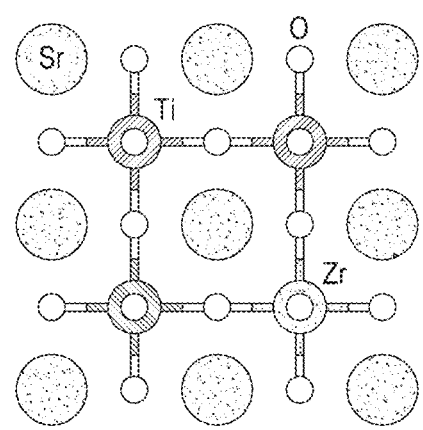
FIG. 3B shows an example ($SrTiO_3 \rightarrow SrTi_xZr_{1-x}O_3$) of substituting and doping Ti in $SrTiO_3$ to Zr.

For example, $SrTiO_3$ may be applied to the dielectric material layer 100 as the compound expressed by $ABO_3$, and any one of Sr and Ti may be substituted and doped. For example, Sr may be substituted and doped with Ba, or Ti may be substituted and doped with any one of Zr, Hf and Sn. FIG. 3A shows an example ($SrTiO_3 \rightarrow Sr_xBa_{1-x}TiO_3$) of substituting and doping Sr in $SrTiO_3$ with Ba. FIG. 3B shows an example ($SrTiO_3 \rightarrow SrTi_xZr_{1-x}O_3$) of substituting and doping Ti in $SrTiO_3$ with Zr.

Figure 4:
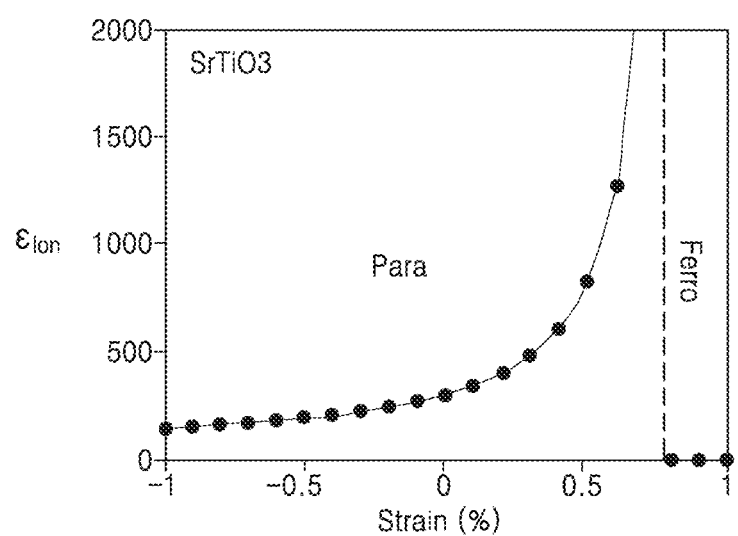
FIG. 4 is a graph showing a change of a permittivity according to a strain with respect to $SrTiO_3$ and a ferroelectric transition from paraelectric to ferroelectric.
Figure 5:
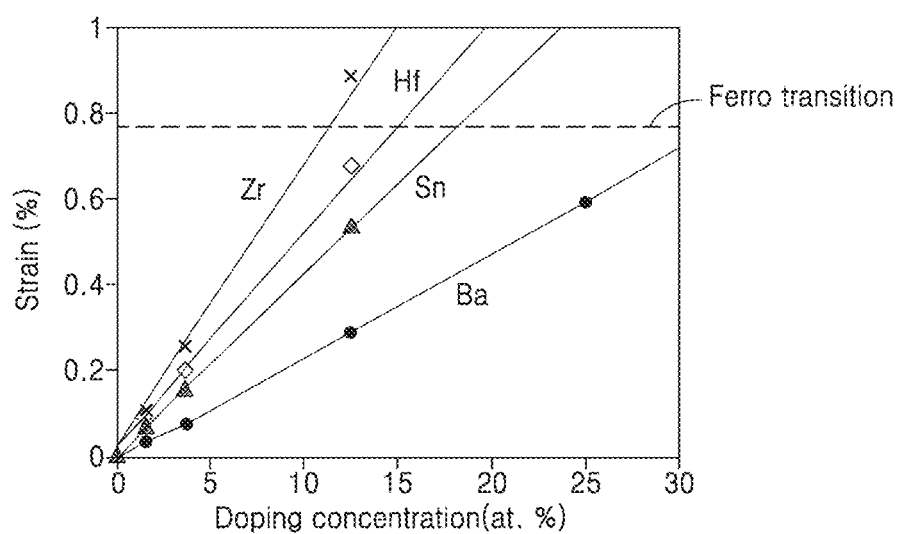
FIG. 5 shows a change of a tensile strain according to a doping concentration when $SrTiO_3$ is applied to a dielectric material layer as a compound expressed by $ABO_3$, Sr is substituted and doped with Ba, or Ti is substituted and doped with Zr, Hf, or Sn.

FIG. 4 is a graph showing a change of a permittivity according to a strain and a ferroelectric transition from paraelectric Para to ferroelectric Ferro with respect to $SrTiO_3$. FIG. 5 shows a change of a tensile strain according to a doping concentration when $SrTiO_3$ is applied to the dielectric material layer 100 as a compound expressed by $ABO_3$, Sr is substituted and doped with Ba, or Ti is substituted and doped with Zr, Hf or Sn. In FIG. 5, a dashed line indicates a position at which the ferroelectric transition occurs from paraelectric Para to ferroelectric Ferro as the doping concentration increases.

As may be seen in FIGS. 4 and 5, when $SrTiO_3$ is applied to the dielectric material layer 100 as the compound expressed by $ABO_3$, and any one of Sr and Ti is substituted and doped, as the doping concentration increases, the tensile strain increases and the permittivity increases, and when the doping concentration is equal to or greater than a predetermined (or alternatively, desired) value, the ferroelectric transition may occur from paraelectric Para to ferroelectric Ferro.

FIG. 6 shows a doping concentration range in which a ferroelectric transition occurs from paraelectric to ferroelectric when $SrTiO_3$ is applied to the dielectric material layer 100 as a compound expressed by $ABO_3$, and mono doping ($Sr_{1-x}A'_xTiO_3$ or $SrTi_{1-x}B'_xO_3$) of substituting and doping ($Ba_{Sr}$) Sr with Ba, substituting and doping ($Ti_{Zr}$) Ti with Zr, substituting and doping ($Ti_{Hf}$) Ti with Hf, or substituting and doping ($Ti_{Sn}$) Ti with Sn is performed.

Referring to FIG. 6, when Sr is substituted and doped with Ba at 32.3 at. % or more, Ti is substituted and doped with Zr at 11.4 at. % or more, Ti is substituted and doped with Hf at 15.1 at. % or more, or Ti is substituted and doped with Sn at 18.4 at. % or more, the ferroelectric transition may occur from paraelectric to ferroelectric. FIG. 6 shows that when Sr is substituted and doped with Ba or Ti is substituted and doped with Zr, Hf, or Sn, substitution and doping is performed, for example, in the range of 50% or less, wherein substitution and doping may be performed up to 50% or more so as to achieve a desired dielectric property conversion.

In another embodiment, $SrTiO_3$ may be applied to the dielectric material layer 100 as the compound expressed by $ABO_3$, and both Sr and Ti may be substituted and doped. For example, Sr may be substituted and doped with Ba and Ti may be substituted and doped with any one of Hf, Zr and Sn.

In addition, Sr may be substituted and doped with La, and Ti may be substituted and doped with any one of In, Sc, and Y.

Figure 7A:
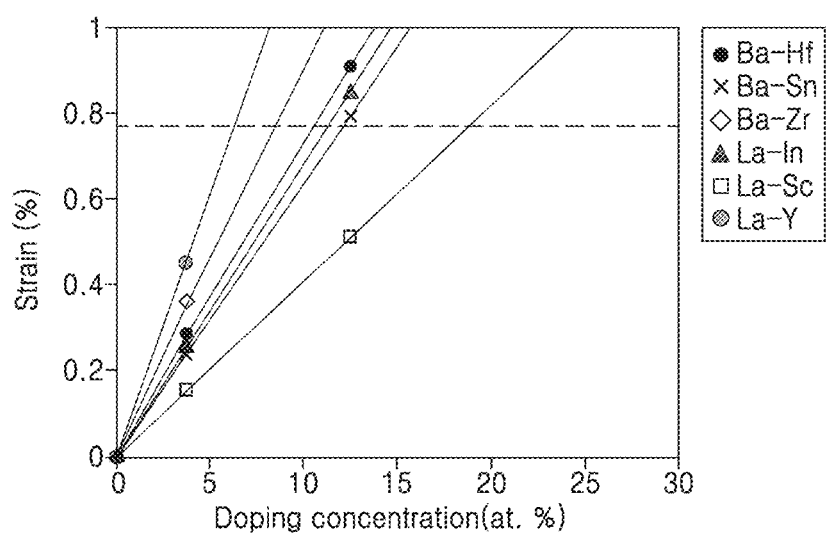
FIG. 7A shows embodiments in which $SrTiO_3$ is applied to a dielectric material layer as a compound expressed by $ABO_3$ and both Sr and Ti are substituted and doped, and shows a change of a tensile strain according to a doping concentration when Sr is substituted and doped with Ba and Ti is substituted and doped with any one of Hf, Zr, and Sn and when Sr is substituted and doped with La and Ti is substituted and doped with any one of In, Sc, and Y.

FIG. 7A shows embodiments in which $SrTiO_3$ is applied to the dielectric material layer 100 as a compound expressed by $ABO_3$, and both Sr and Ti are substituted and doped, and shows a change of a tensile strain according to a doping concentration when Sr is substituted and doped with Ba and Ti is substituted and doped with any one of Hf, Zr, and Sn and when Sr is substituted and doped with La and Ti is substituted and doped with any one of In, Sc, and Y. In FIG. 7A, a dashed line indicates a position at which a ferroelectric transition occurs from paraelectric to ferroelectric as the doping concentration increases.

As may be seen in FIG. 7A, when $SrTiO_3$ is applied to the dielectric material layer 100 as the compound expressed by $ABO_3$, and both Sr and Ti are substituted and doped, as the doping concentration increases, a tensile strain increases and a permittivity increases, and when the doping concentration is equal to or greater than a predetermined (or alternatively, desired) value, the ferroelectric transition may occur from paraelectric to ferroelectric.

FIG. 7B shows a doping concentration range in which the ferroelectric transition occurs from paraelectric to ferroelectric when $SrTiO_3$ is applied to the dielectric material layer 100 as the compound expressed by $ABO_3$, both Sr and Ti are substituted and doped, co-doping $(Sr_{1-x}A'_xTi_{1-y}B'_yO_3)$ of substituting and doping $(Ba_{Sr}$—$Hf_{Ti})$ Sr and Ti with Ba and Hf, respectively, substituting and doping $(Ba_{Sr}$—$Zr_{Ti})$ Sr and Ti with Ba and Zr, respectively, and substituting and doping $(Ba_{Sr}$—$Sn_{Ti})$ Sr and Ti with Ba and Sn, respectively is performed, and a ratio (x:y) at which Sr and Ti are substituted and doped with dopants is 1:0.5, 1:1, 1:1.5, and 1:2.

Referring to FIG. 7B, in the case where the ratio at which Sr is substituted and doped with Ba, and Ti is substituted and doped with Hf, is 1:0.5, 1:1, 1:1.5, and 1:2, when Sr is substituted and doped with Ba at 15.5 at. % or more, at 10.3 at. % or more, at 7.7 at. % or more, and at 6.1 at. % or more, in the case where the ratio at which Sr is substituted and doped with Ba, and Ti is substituted and doped with Zr, is 1:0.5, 1:1, 1:1.5, and 1:2, when Sr is substituted and doped with Ba at 13.2 at. % or more, at 8.4 at. % or more, at 6.1 at. % or more, and at 4.8 at. % or more, or in the case where the ratio at which Sr is substituted and doped with Ba, Ti is substituted and doped with Sn is 1:0.5, 1:1, 1:1.5, and 1:2, when Sr is substituted and doped with Ba at 17.1 at. % or more, at 11.7 at. % or more, at 8.9 at. % or more, and at 7.2 at. % or more, the ferroelectric transition may occur from paraelectric to ferroelectric. FIG. 7B shows that when co-doping $(Sr_{1-x}A'_xTi_{1-y}B'_yO_3)$ of substituting and doping $(Ba_{Sr}$—$Hf_{Ti})$ Sr and Ti with Ba and Hf, respectively, substituting and doping $(Ba_{Sr}$—$Zr_{Ti})$ Sr and Ti with Ba and Zr, respectively, and substituting and doping $(Ba_{Sr}$—$Sn_{Ti})$ Sr and Ti with Ba and Sn, respectively is performed and the ratio (x:y) at which Sr and Ti are substituted and doped with dopants is 1:0.5, 1:1, 1:1.5, and 1:2, substitution and doping is performed, for example, in the range of 50% or less, wherein substitution and doping may be performed up to 50% or more so as to achieve a desired dielectric property conversion.

FIGS. 7A and 7B show an embodiment in which $SrTiO_3$ is applied to the dielectric material layer 100 as the compound expressed by $ABO_3$ and co-doping $(Sr_{1-x}A'_x Ti_{1-y}B'_yO_3)$ of substituting and doping both Sr and Ti is performed, and the case where Sr is substituted and doped with Ba and Ti is substituted and doped with any one of HF, Zr, and Sn, which is an example, and various embodiments of an element of substituting and doping Sr and an element of substituting and doping Ti in co-doping $(Sr_{1-x}A'_x Ti_{1-y}B'_yO_3)$ of substituting and doping both Sr and Ti may be possible. In addition, FIGS. 7A and 7B show the case where the ratio (x:y) at which Sr and Ti are substituted and doped with dopants is 1:0.5, 1:1, 1:1.5, and 1:2, which is an example, and various embodiments of the substituted and doped ratio (x:y) may be possible, and a change in the ratio (x:y) may be continuous.

In another embodiment, $SrTiO_3$ may be applied to the dielectric material layer 100 as the compound expressed by $ABO_3$, both Sr and Ti may be substituted and doped, Sr may be substituted and doped with any one of Cs, Rb, and K, and Ti may be substituted and doped with any one of Nb and Ta.

Figure 8A:
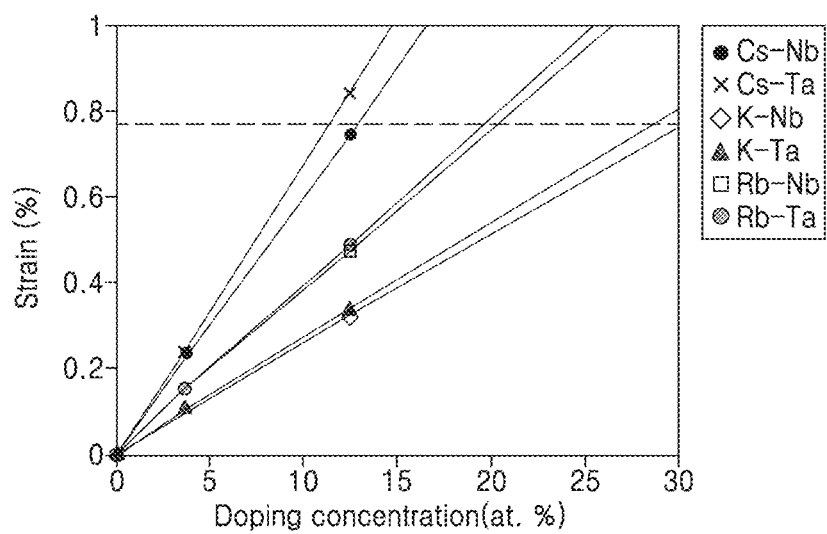
FIG. 8A shows embodiments in which $SrTiO_3$ is applied to a dielectric material layer as a compound expressed by $ABO_3$ and both Sr and Ti are substituted and doped, and shows a change of a tensile strain according to a doping concentration when Sr is substituted and doped with any one of Cs, Rb, and K and Ti is substituted and doped with any one of Nb and Ta.

FIG. 8A shows embodiments in which $SrTiO_3$ is applied to the dielectric material layer 100 as a compound expressed by $ABO_3$ and both Sr and Ti are substituted and doped, and shows a change of a tensile strain according to a doping concentration when Sr is substituted and doped with any one of Cs, Rb, and K and Ti is substituted and doped with any one of Nb and Ta. In FIG. 8A, a dashed line indicates a position at which a ferroelectric transition occurs from paraelectric to ferroelectric as the doping concentration increases.

As may be seen in FIG. 8A, when $SrTiO_3$ is applied to the dielectric material layer 100 as the compound expressed by $ABO_3$ and both Sr and Ti are substituted and doped, as the doping concentration increases, a tensile strain increases and a permittivity increases, and when the doping concentration is equal to or greater than a predetermined (or alternatively, desired) value, the ferroelectric transition may occur from paraelectric to ferroelectric.

FIG. 8B shows a doping concentration range in which a ferroelectric transition occurs from paraelectric to ferroelectric when $SrTiO_3$ is applied to the dielectric material layer 100 as a compound expressed by $ABO_3$, both Sr and Ti are substituted and doped, and co-doping $(Sr_{1-x}A'_xTi_{1-y}B'_yO_3)$ of substituting and doping $(Cs_{Sr}$—$Nb_{Ti})$ Sr and Ti with Cs and Nb, respectively, substituting and doping $(Cs_{Sr}$—$Ta_{Ti})$ Sr and Ti with Cs and Ta, respectively, substituting and doping $(Rb_{Sr}$—$Nb_{Ti})$ Sr and Ti with Rb and Nb, respectively, substituting and doping $(Rb_{Sr}$—$Ta_{Ti})$ Sr and Ti with Rb and Ta, respectively, substituting and doping $(K_{Sr}$—$Nb_{Ti})$ Sr and Ti with K and Nb, respectively, substituting and doping $(K_{Sr}$—$Ta_{Ti})$ Sr and Ti with K and Ta, respectively, substituting and doping $(La_{Sr}$—$In_{Ti})$ Sr and Ti with La and In, respectively, substituting and doping $(La_{Sr}$—$Sc_{Ti})$ Sr and Ti with La and Sc, respectively, and substituting and doping $(La_{Sr}$—$Y_{Ti})$ Sr and Ti with La and Y, respectively is performed.

Referring to FIG. 8B, when Sr and Ti are substituted and doped with Cs and Nb, respectively, at 12.9 at. % or more, Sr and Ti are substituted and doped with Cs and Ta, respectively, at 11.5 at. % or more, Sr and Ti are substituted and doped with Rb and Nb, respectively, at 20.6 at. % or more, Sr and Ti are substituted and doped with Rb and Ta respectively at 19.8 at. % or more, Sr and Ti are substituted and doped with K and Nb, respectively, at 30.5 at. % or more, Sr and Ti are substituted and doped with K and Ta, respectively, at 28.8 at. % or more, Sr and Ti are substituted and doped with La and In, respectively, at 11.4 at. % or more, Sr and Ti are substituted and doped with La and Sc, respectively, at 18.9 at. % or more, or Sr and Ti are substituted and doped with La and Y, respectively, at 6.3 at. % or more, the ferroelectric transition may occur from paraelectric to ferroelectric. FIG. 8B shows that when co-doping $(Sr_{1-x}A'_xTi_{1-x}B'_xO_3)$ of substituting and doping Sr with any one of Cs, Rb, and K, substituting and doping Ti with any one of Nb and Ta or substituting and doping Sr with La and substituting and doping Ti with any one of In, Sc, and Y is performed, substitution and doping is performed, for example, in the range of 50% or less, wherein substitution and doping may be performed up to 50% or more so as to achieve a desired dielectric property conversion.

In another embodiment, $KTaO_3$ may be applied to the dielectric material layer 100 as the compound expressed by $ABO_3$, and at least one of K and Ta may be substituted and doped.

Figure 9:
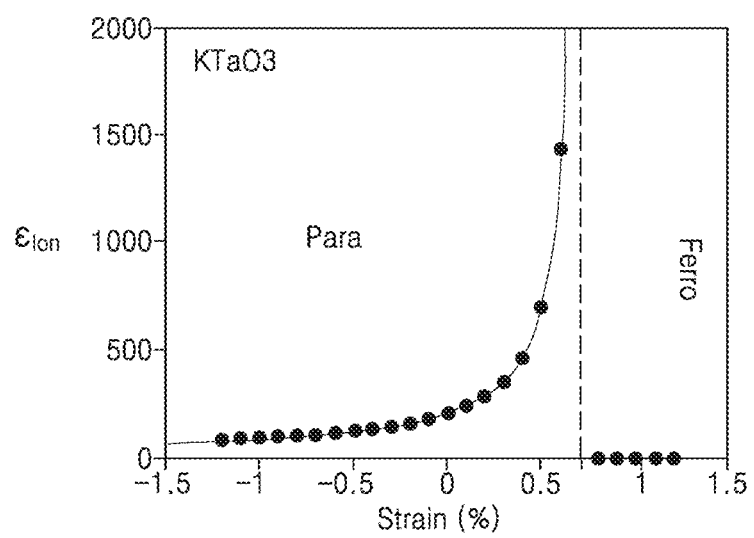
FIG. 9 is a graph showing a change of a permittivity according to a strain with respect to $KTaO_3$ and a ferroelectric transition from paraelectric to ferroelectric.
Figure 10A:
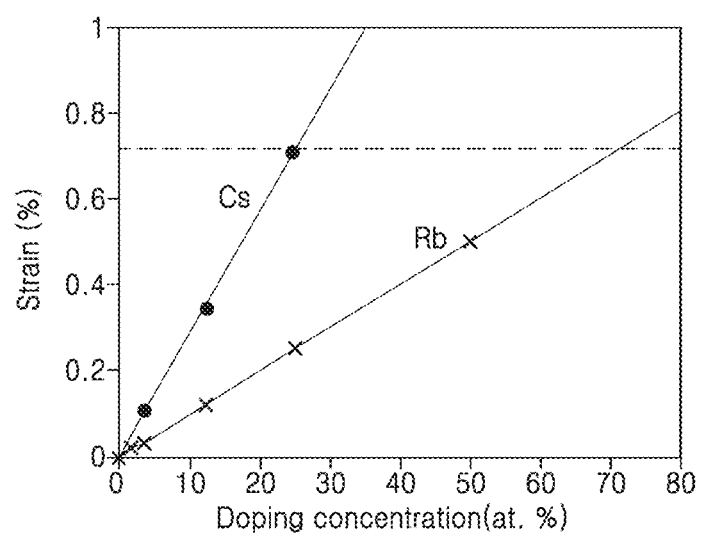
FIG. 10A shows a change of a tensile strain according to a doping concentration when $KTaO_3$ is applied to a dielectric material layer as a compound expressed by $ABO_3$, K is substituted and doped with Cs or Rb.

FIG. 9 is a graph showing a change of a permittivity according to a strain with respect to $KTaO_3$ and a ferroelectric transition from paraelectric Para to ferroelectric Ferro. FIG. 10A shows a change of a tensile strain according to a doping concentration when $KTaO_3$ is applied to the dielectric material layer 100 as a compound expressed by $ABO_3$ and, K is substituted and doped with Cs or Rb. In FIG. 10A, a dashed line indicates a position at which the ferroelectric transition occurs from paraelectric Para to ferroelectric Ferro as the doping concentration increases. FIG. 10B shows a doping concentration range in which a ferroelectric transition occurs from paraelectric to ferroelectric when $KTaO_3$ is applied to the dielectric material layer 100 as a compound expressed by $ABO_3$, and mono doping ($K_{1-x}A'_xTaO_3$) of substituting and doping ($Cs_K$) K with Cs and substituting and doping ($Rb_K$) K with Rb is performed.

Referring to FIGS. 9 and 10A, when $KTaO_3$ is applied to the dielectric material layer 100 as the compound expressed by $ABO_3$ and K is substituted and doped with any one of Cs and Rb, as the doping concentration increases, the tensile strain increases and the permittivity increases, and when the doping concentration is equal to or greater than a predetermined (or alternatively, desired) value, the ferroelectric transition may occur from paraelectric Para to ferroelectric Ferro.

Also, referring to FIG. 10B, when K is substituted and doped with Cs at 24.7 at. % or more, or K is substituted and doped with Rb at 71.3 at. % or more, the ferroelectric transition may occur from paraelectric to ferroelectric. FIGS. 10A and 10B show that when K is substituted and doped with Cs, substitution and doping is performed, for example, in the range of 50% or less, wherein substitution and doping may be performed up to 50% or more so as to achieve a desired dielectric property conversion.

In another embodiment, $KTaO_3$ may be applied to the dielectric material layer 100 as the compound expressed by $ABO_3$, and both K and Ta may be substituted and doped. For example, K may be substituted and doped with Ba and Ta may be substituted and doped with any one of In, Sc, and Y. At this time, in comparison to the substitution and doping Ta with any one of In, Sc, and Y, the substitution and doping of K with Ba may be performed at a ratio of 2:1, that is, (K→2Ba, Ta→In, Sc, or Y). In addition, K may be substituted and doped with Ba, and Ta may be substituted and doped with any one of Hf, Sn, and Zr. In addition, K may be substituted and doped with La, and Ta may be substituted and doped with any one of In, Sc, and Y.

Figure 11A:
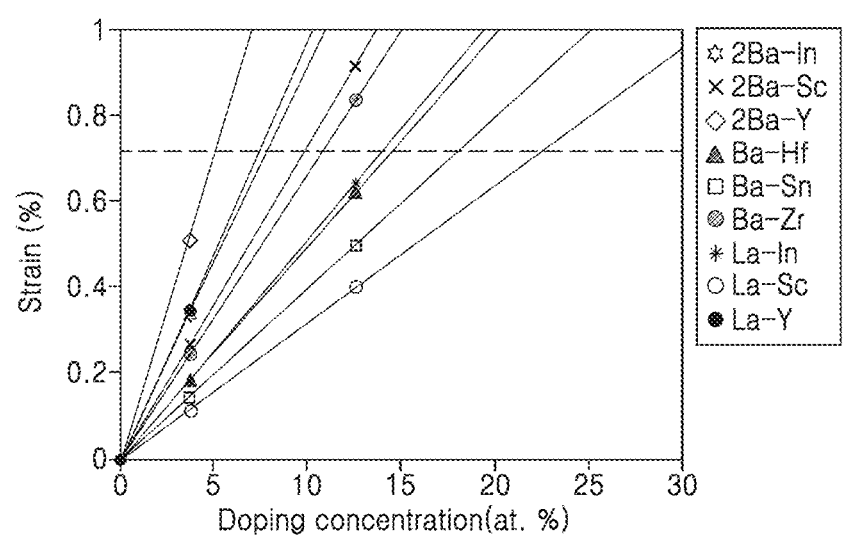
FIG. 11A shows embodiments in which $KTaO_3$ is applied to a dielectric material layer as a compound expressed by $ABO_3$ and both K and Ta are substituted and doped, and shows a change of a tensile strain according to a doping concentration when K is substituted and doped with 2Ba and Ta is substituted and doped with any one of In, Sc, and Y, when K is substituted and doped with Ba and Ta is substituted and doped with any one of Hf, Sn, and Zr, and when K is substituted and doped with La and Ta is substituted and doped with any one of In, Sc, and Y.

FIG. 11A shows embodiments in which $KTaO_3$ is applied to the dielectric material layer 100 as a compound expressed by $ABO_3$ and both K and Ta are substituted and doped, and shows a change of a tensile strain according to a doping concentration when K is substituted and doped with 2Ba and Ta is substituted and doped with any one of In, Sc, and Y, when K is substituted and doped with Ba and Ta is substituted and doped with any one of Hf, Sn, and Zr, and when K is substituted and doped with La and Ta is substituted and doped with any one of In, Sc, and Y. In FIG. 11A, a dashed line indicates a position at which a ferroelectric transition occurs from paraelectric to ferroelectric as the doping concentration increases.

As may be seen in FIG. 11A, when $KTaO_3$ is applied to the dielectric material layer 100 as the compound expressed by $ABO_3$, and both K and Ta are substituted and doped, as the doping concentration increases, a tensile strain increases and a permittivity increases, and when the doping concentration is equal to or greater than a predetermined (or alternatively, desired) value, the ferroelectric transition may occur from paraelectric to ferroelectric.

FIG. 11B shows a doping concentration range in which the ferroelectric transition occurs from paraelectric to ferroelectric when $KTaO_3$ is applied to the dielectric material layer 100 as the compound expressed by $ABO_3$, both K and Ta are substituted and doped, and co-doping ($K_{1-2x}A'_{2x}Ta_{1-x}B'_xO_3$) of substituting and doping ($2Ba_K$—$In_{Ta}$) K and Ta with 2Ba and In, respectively, substituting and doping ($2Ba_K$—$Sc_{Ta}$) K and Ta with 2Ba and Sc, respectively, and substituting and doping ($2Ba_K$—$Y_{Ta}$) K and Ta with 2Ba and Y, respectively, is performed.

Referring to FIG. 11B, when K and Ta are substituted and doped with 2Ba and In, respectively, at 7.8 at. % or more, K and Ta are substituted and doped with 2Ba and Sc, respectively, at 9.8 at. % or more, or K and Ta are substituted and doped with 2Ba and Y, respectively, at 5.0 at. % or more, the ferroelectric transition may occur from paraelectric to ferroelectric. FIG. 11B shows that when co-doping ($K_{1-2x}A'_{2x}Ta_{1-x}B'_xO_3$) of substituting and doping K with 2Ba and substituting and doping Ta with any one of In, Sc, and Y is performed, because K is double substituted and doped with Ba compared to substituting and doping Ta with any one of In, Sc, and Y, when substitution and doping of K are performed, for example, within a range of 50% or less, substitution and doping of Ta may be performed, for example, up to 25% or less, substitution and doping of K may be performed up to 50% or more so as to achieve a desired dielectric property conversion, and thus substitution and doping of Ta may also be performed up to 25% or more.

FIG. 11C shows a doping concentration range in which the ferroelectric transition occurs from paraelectric to ferroelectric when $KTaO_3$ is applied to the dielectric material layer 100 as the compound expressed by $ABO_3$, both K and Ta are substituted and doped, and co-doping ($K_{1-x}A'_xTa_{1-x}B'_xO_3$) of substituting and doping ($Ba_K$—$Hf_{Ta}$) K and Ta with Ba and Hf, respectively, substituting and doping ($Ba_K$—$Sn_{Ta}$) K and Ta with Ba and Sn, respectively, substituting and doping ($Ba_K$—$Zr_{Ta}$) K and Ta with Ba and Zr, respectively, substituting and doping ($La_K$—$In_{Ta}$) K and Ta with La and In, respectively, substituting and doping ($La_K$—$Sc_{Ta}$) K and Ta with La and Sc respectively, substituting and doping ($La_K$—$Y_{Ta}$) K and Ta with La and Y, respectively is performed.

Referring to FIG. 11C, when K and Ta are substituted and doped with Ba and Hf, respectively, at 14.4 at. % or more, K and Ta are substituted and doped with Ba and Sn, respectively, at 17.9 at. % or more, K and Ta are substituted and doped with Ba and Zr, respectively, at 10.7 at. % or more, K and Ta are substituted and doped with La and In, respectively, at 13.9 at. % or more, K and Ta are substituted and doped with La and Sc, respectively, at 22.3 at. % or more, K and Ta are substituted and doped with La and Y, respectively, at 7.4 at. % or more, the ferroelectric transition may occur from paraelectric to ferroelectric. FIG. 11C shows that when co-doping ($K_{1-x}A'_xTa_{1-x}B'_xO_3$) of substituting and doping K with Ba and substituting and doping Ta with any one of Hf, Sn, and Zr, or substituting and doping K with La and substituting and doping Ta with any one of In, Sc, and Y is performed, substitution and doping is performed, for example, in the range of 50% or less, wherein substitution and doping may be performed up to 50% or more so as to achieve a desired dielectric property conversion.

Property values of the dielectric material layer 100 according to various embodiments described above may relate to room temperature, the property values may vary according to a temperature, and the dielectric property of the dielectric material layer 100 may vary according to the temperature. The dielectric material layer 100 according to various embodiments described above may be applied to the thin film structure 10 as shown in FIG. 2, and the thin film structure 10 including the dielectric material layer 100 according to an embodiment may be applied to various electronic devices.

Figure 12:
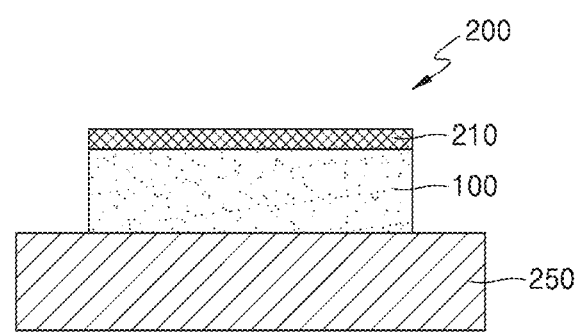
FIG. 12 schematically shows an example of an electronic device to which a thin film structure including a dielectric material layer is applied according to an embodiment.

FIG. 12 schematically shows an example of an electronic device 200 to which a thin film structure including a dielectric material layer 100 is applied according to an embodiment.

Referring to FIG. 12, the electronic device 200 may include an upper electrode layer 210 on the dielectric material layer 100 of the thin film structure. A substrate 250 may be disposed on a lower portion of the dielectric material layer 100 of the thin film structure. Various configurations of the electronic device 200 may be disposed on the substrate 250.

In an embodiment, the dielectric material layer 100 may be formed by substituted and doped at a doping concentration by which transition from paraelectric to ferroelectric is performed so as to exhibit a ferroelectric property, as in various embodiments described above.

Figure 13:
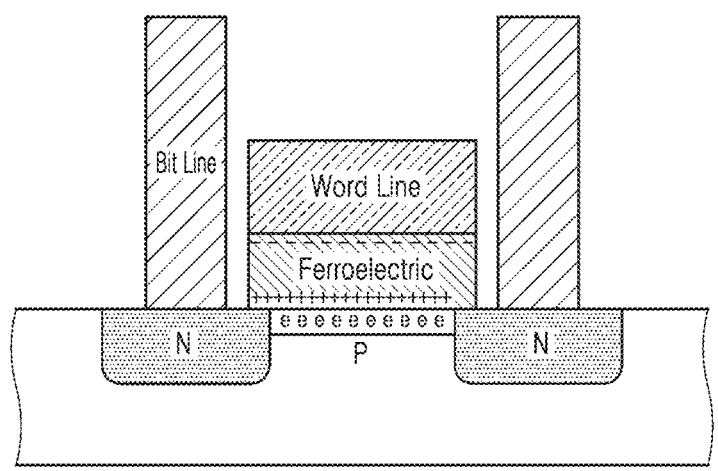
FIG. 13 shows an example of a ferroelectric memory device.

When the dielectric material layer 100 is provided to exhibit such a ferroelectric property, the electronic device 200 may implement, for example, a nonvolatile memory device such as a FERAM device, etc. as illustrated in FIG. 13. The FERAM device of FIG. 13 is an example, and although the electronic device 200 according to an embodiment is implemented as a nonvolatile memory device such as the FERAM device, the embodiment is not limited thereto. The structure of the electronic device 200 may be variously modified.

Figure 14:
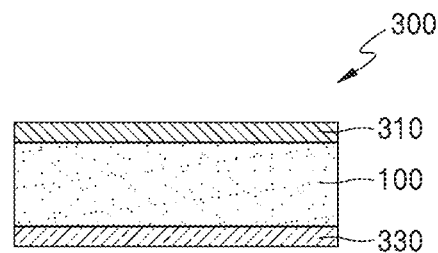
FIG. 14 schematically shows another example of an electronic device to which a thin film structure including a dielectric material layer is applied according to an embodiment.

FIG. 14 schematically shows another example of an electronic device 300 to which a thin film structure including the dielectric material layer 100 is applied according to the embodiment.

Referring to FIG. 14, the electronic device 300 may include first and second metal layers 330 and 310 respectively on both sides of the dielectric material layer 100 of the thin film structure. A structure of the dielectric material layer 100 and the first and second metal layers 330 and 310 respectively on both sides thereof may be formed vertically on a substrate (not shown), or the first metal layer 330, the dielectric material layer 100, and the second metal layer 310 may be sequentially stacked on the substrate to form a device such as a capacitor.

At this time, the electronic device 300 may be the capacitor itself, and may be implemented as a memory device in which the capacitor is included in a unit cell of a memory.

At this time, the dielectric material layer 100 of the capacitor, as in various embodiments described above, may be substituted and doped at a doping concentration that may exhibit a higher permittivity within a range having a paraelectric property so as to exhibit a higher permittivity property. When the dielectric material layer 100 is provided to exhibit such a higher permittivity property, the electronic device 300 may be implemented as various electronic devices, for example, a memory device capable of fast access, such as a dynamic random access memory (DRAM) device or a capacitor.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A memory device comprising:
a dielectric material layer; and
first and second metal layers on both sides of the dielectric material layer,
wherein the dielectric material layer comprising a compound expressed by $ABO_3$, wherein at least one of A and B in $ABO_3$ is substituted and doped with another atom having a larger atom radius, and $ABO_3$ becomes $A_{1-x}A'_xB_{1-y}B'_yO_3$ through substitution and doping, where x>0, y>=0, and a dopant A' has an atom radius greater than A and/or a dopant B' has an atom radius greater than B,
wherein a dielectric material property of the dielectric material layer varies according to a type of a substituted and doped dopant and a substitution doping concentration, and
wherein A is Sr, B is Ti,
A' is any one selected from Cs, Rb, and K, and
B' is any one selected from Zr, Hf, Sn, Nb, and Ta.

2. The memory device of claim 1, wherein atoms of A and A', B and B', or A+B and A'+B' have same valence electron number.

3. The memory device of claim 1, wherein a tensile strain is induced through substitution and doping such that the dielectric material layer converts a paraelectric material to a ferroelectric material or improves a dielectric constant.

4. The memory device of claim 1, wherein the compound expressed by $ABO_3$ is $SrTiO_3$, and
Sr is substituted and doped with any one of Cs, Rb, and K, and Ti is substituted and doped with any one of Nb and Ta, or
Sr is substituted and doped with La and Ti is substituted and doped with any one of In, Sc, and Y.

5. The memory device of claim 4, wherein Sr and Ti are substituted and doped with Cs and Nb, respectively, at 12.9 at. % or more,
Sr and Ti are substituted and doped with Cs and Ta, respectively, at 11.5 at. % or more,
Sr and Ti are substituted and doped with Rb and Nb, respectively, at 20.6 at. % or more,
Sr and Ti are substituted and doped with Rb and Ta, respectively, at 19.8 at. % or more,
Sr and Ti are substituted and doped with K and Nb, respectively, at 30.5 at. % or more,
Sr and Ti are substituted and doped with K and Ta, respectively, at 28.8 at. % or more,
Sr and Ti are substituted and doped with La and In, respectively, at 11.4 at. % or more,
Sr and Ti are substituted and doped with La and Sc, respectively, at 18.9 at % or more, or Sr and Ti are substituted and doped with La and Y, respectively, at 6.3 at. % or more.

6. The memory device of claim 1, wherein substitution and doping of any one of A and B or each of A and B of the dielectric material layer is performed in a range of 50% or less.

7. The memory device of claim 1, wherein the first metal layer, the dielectric material layer, and the second metal layer constitute a capacitor in included in a unit cell of a DRAM device.

8. A memory device comprising:
a dielectric material layer; and
first and second metal layers on both sides of the dielectric material layer,
wherein the dielectric material layer comprising a compound expressed by $ABO_3$, wherein at least one of A and B in $ABO_3$ is substituted and doped with another atom having a larger atom radius, and $ABO_3$ becomes $A_{1-x}A'_xB_{1-y}B'_yO_3$ through substitution and doping, where $x>=0$, $y>0$, and a dopant A' has an atom radius greater than A and/or a dopant B' has an atom radius greater than B,
wherein a dielectric material property of the dielectric material layer varies according to a type of a substituted and doped dopant and a substitution doping concentration, and
wherein A is Sr, B is Ti,
A' is any one selected from Ba, Cs, Rb, and K, and
B' is any one selected from Zr and Hf,
wherein the compound expressed by $ABO_3$ is $SrTiO_3$, and Ti is substituted and doped with any one of Zr and Hf.

9. The memory device of claim 8, wherein Ti is substituted and doped with Zr at 11.4 at. % or more, Ti is substituted and doped with Hf at 15.1 at. % or more.

10. The memory device of claim 8, wherein Sr is substituted and doped with Ba at 32.3 at. % or more.

11. The memory device of claim 8, wherein Sr is substituted and doped with Ba.

12. The memory device of claim 8, wherein the first metal layer, the dielectric material layer, and the second metal layer constitute a capacitor in included in a unit cell of a DRAM device.

13. A memory device comprising:
a dielectric material layer; and
first and second metal layers on both sides of the dielectric material layer,
wherein the dielectric material layer comprising a compound expressed by $ABO_3$, wherein at least one of A and B in $ABO_3$ is substituted and doped with another atom having a larger atom radius, and $ABO_3$ becomes $A_{1-x}A'_xB_{1-y}B'_yO_3$ through substitution and doping, where $x>=0$, $y>=0$, at least one of x and $y \neq 0$ and a dopant A' has an atom radius greater than A and/or a dopant B' has an atom radius greater than B,
wherein a dielectric material property of the dielectric material layer varies according to a type of a substituted and doped dopant and a substitution doping concentration, and
wherein A is K and B is Ta,
A' is any one selected from Cs, Rb, Ba, and La, and
B' is any one selected from In, Sc, Y, Hf, Sn, and Zr.

14. The memory device of claim 13, wherein the compound expressed by $ABO_3$ is $KTaO_3$, K is substituted and doped with Cs at 24.7 at. % or more and 50 at. % or less, or K is substituted and doped with Rb at 71.3 at. % or more.

15. The memory device of claim 13,
wherein the compound expressed by $ABO_3$ is $KTaO_3$, K and Ta are substituted and doped,
K and Ta are substituted and doped with Ba and In, respectively, at 7.8 at. % or more,
K and Ta are substituted and doped with Ba and Sc, respectively, at 9.8 at. % or more, or K and Ta are substituted and doped with Ba and Y, respectively, at 5.0 at. % or more.

16. The memory device of claim 15, wherein substitution and doping of A of the dielectric material layer is performed in a range of 50% or less, substitution and doping of B is performed in a range of 25% or less, and
substitution and doping of A and B is performed at a ratio of 2:1.

17. The memory device of claim 13,
wherein the compound expressed by $ABO_3$ is $KTaO_3$,
K and Ta are substituted and doped with Ba and Hf, respectively, at 14.4 at. % or more,
K and Ta are substituted and doped with Ba and Sn, respectively, at 17.9 at. % or more,
K and Ta are substituted and doped with Ba and Zr, respectively, at 10.7 at. % or more,
K and Ta are substituted and doped with La and In, respectively, at 13.9 at. % or more,
K and Ta are substituted and doped with La and Sc, respectively, at 22.3 at. % or more, or
K and Ta are substituted and doped with La and Y, respectively, at 7.4 at. % or more.

18. The memory device of claim 13, wherein the first metal layer, the dielectric material layer, and the second metal layer constitute a capacitor included in a unit cell of a DRAM device.

* * * * *